US011249569B2

(12) United States Patent
Ye

(10) Patent No.: US 11,249,569 B2
(45) Date of Patent: Feb. 15, 2022

(54) FLEXIBLE DISPLAY PANEL AND FLEXIBLE DISPLAY DEVICE

(71) Applicant: Wuhan China Star Optoelectronics Semiconductor Display Technology Co., Ltd., Hubei (CN)

(72) Inventor: Jian Ye, Guangdong (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 614 days.

(21) Appl. No.: 16/072,632

(22) PCT Filed: Mar. 5, 2018

(86) PCT No.: PCT/CN2018/078057
§ 371 (c)(1),
(2) Date: Jul. 25, 2018

(87) PCT Pub. No.: WO2019/153396
PCT Pub. Date: Aug. 15, 2019

(65) Prior Publication Data
US 2021/0081063 A1    Mar. 18, 2021

(30) Foreign Application Priority Data
Feb. 9, 2018 (CN) .......................... 201810134400.X

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *H01L 27/323* (2013.01);
(Continued)

(58) Field of Classification Search
CPC .... G09G 5/02; G09G 2320/0666; G09G 5/10; G09G 2354/00; G09G 2340/06;
(Continued)

(56) References Cited

U.S. PATENT DOCUMENTS 10,719,680 B2 * 7/2020 Ye .......................... G06F 3/0443
2006/0057502 A1 * 3/2006 Okada ................... C23C 18/143
430/313
(Continued)

FOREIGN PATENT DOCUMENTS

CN          103150073 A    6/2013
CN          203825588 U    9/2014
(Continued)

OTHER PUBLICATIONS

International Search Report in Application No. PCT/CN2018/078057, 9PP.
(Continued)

*Primary Examiner* — Olga V Merkoulova
(74) *Attorney, Agent, or Firm* — Leong C. Lei

(57) ABSTRACT

Disclosed is a flexible display panel, comprising a flexible substrate; an organic light emitting diode layer, disposed on the flexible substrate, wherein the organic light emitting diode layer comprises a plurality of sub pixels arranged at intervals; a metal mesh, disposed on the organic light emitting diode layer, wherein metal traces of the metal mesh are correspondingly arranged in gaps among the plurality of sub pixels disposed at intervals, and the metal traces of the metal mesh surround to form a plurality of touch electrodes, and at least one of the touch electrodes comprises at least one first touch area, and the first touch area is correspondingly arranged with at least two of the sub pixels. The flexible display panel can improve the display effect of the
(Continued)

flexible display panel by reducing the arrangement density of the metal traces of the metal mesh.

20 Claims, 9 Drawing Sheets

(51) Int. Cl.
  *H01L 27/32* (2006.01)
  *H01L 51/00* (2006.01)
(52) U.S. Cl.
  CPC ...... *H01L 27/3218* (2013.01); *H01L 51/0097* (2013.01); *G06F 2203/04102* (2013.01); *G06F 2203/04111* (2013.01); *G06F 2203/04112* (2013.01); *H01L 2251/5338* (2013.01)
(58) Field of Classification Search
  CPC ......... G09G 3/2003; G09G 2320/0242; G09G 2320/0626; G09G 2360/16; G09G 2360/144; G09G 2300/0452; G09G 2320/0693; G09G 2380/08; G06F 3/041
  See application file for complete search history.

(56) References Cited

U.S. PATENT DOCUMENTS

| | | | |
|---|---|---|---|
| 2010/0302206 A1 | 12/2010 | Yu et al. | |
| 2011/0025635 A1* | 2/2011 | Lee | G06F 3/0412 345/173 |
| 2013/0342099 A1* | 12/2013 | Weber | H01L 51/56 313/498 |
| 2014/0042427 A1* | 2/2014 | Hung | H01L 29/786 257/43 |
| 2014/0055429 A1* | 2/2014 | Kwon | G06F 3/013 345/204 |
| 2014/0055702 A1* | 2/2014 | Park | H01L 27/3279 349/43 |
| 2014/0092338 A1* | 4/2014 | Miyazaki | G02F 1/133308 349/58 |
| 2014/0111442 A1* | 4/2014 | Cok | G06F 3/0445 345/173 |
| 2014/0217373 A1* | 8/2014 | Youn | H01L 51/5203 257/40 |
| 2014/0231761 A1* | 8/2014 | Kim | H01L 51/56 257/40 |
| 2014/0232956 A1* | 8/2014 | Kwon | H01L 27/3276 349/12 |
| 2014/0320767 A1* | 10/2014 | Xu | G06F 3/0443 349/12 |
| 2014/0333570 A1* | 11/2014 | Lesonen | G06F 3/0443 345/174 |
| 2015/0015539 A1* | 1/2015 | Fotopoulos | G06F 3/0443 345/174 |
| 2015/0042600 A1* | 2/2015 | Lukanc | G06F 3/0443 345/174 |
| 2015/0116253 A1* | 4/2015 | Schwartz | G06F 3/04186 345/174 |
| 2015/0137102 A1* | 5/2015 | Yang | B32B 38/1833 257/40 |
| 2015/0193041 A1* | 7/2015 | Shepelev | G06F 3/0446 345/174 |
| 2015/0382446 A1* | 12/2015 | Kwon | H01L 27/3276 174/251 |
| 2016/0216815 A1* | 7/2016 | Hashimoto | G06F 3/0412 |
| 2017/0110529 A1* | 4/2017 | Zhang | H01L 51/5253 |
| 2018/0182838 A1* | 6/2018 | Yeo | H01L 27/3279 |
| 2018/0190721 A1* | 7/2018 | Liu | G06F 3/0445 |
| 2019/0179444 A1* | 6/2019 | Ye | G06F 3/0446 |
| 2021/0081063 A1* | 3/2021 | Ye | G06F 3/0412 |

FOREIGN PATENT DOCUMENTS

| | | |
|---|---|---|
| CN | 105549791 A | 5/2016 |
| CN | 106547405 A | 3/2017 |
| CN | 106775050 A | 5/2017 |
| CN | 107122077 A | 9/2017 |
| CN | 107219953 A | 9/2017 |

OTHER PUBLICATIONS

Chinese Office Action issued in corresponding Chinese Patent Application No. 201810134400.X, dated Nov. 28, 2019, Beijing, China.

* cited by examiner

```
G   G   G   G   G   G
  B   R   B   R   B   R
G   G   G   G   G   G
  R   B   R   B   R   B
G   G   G   G   G   G
  B   R   B   R   B   R
G   G   G   G   G   G
  R   B   R   B   R   B
```

FLEXIBLE DISPLAY PANEL AND FLEXIBLE DISPLAY DEVICE

CROSS-REFERENCE TO RELATED APPLICATION

This application is a National Phase of International Application Number PCT/CN2018/078057, filed Mar. 5, 2018, and claims the priority of Chinese Patent Application No. 201810134400.X, entitled "Flexible display panel and flexible display device", filed on Feb. 9, 2018, of which is hereby incorporated in its entirety by reference.

FIELD OF THE INVENTION

The present invention relates to a flexible display field, and more particularly to a flexible display panel and a flexible display device having the flexible display panel.

BACKGROUND OF THE INVENTION

Compared to the conventional display technologies such as liquid crystal display (LCD), the flexible displays possess many advantages, such as low power consumption, bendability, foldable property, thinness, portability and non-breakage. Particularly, a flexible active matrix organic light emitting diode (AMOLED) screen referred to as a next-generation display possesses advantages, such as wider viewing angle and thinner size and will be widely applied to smart phones, smart homes, wearable electronic devices and other electronic devices.

At present, the material of the touch electrode, which is one of the important components of the touch display screen, mainly is indium tin oxide (ITO). However, indium tin oxide is used as a brittle semiconductor material and is not suitable for application for a flexible display screen. Therefore, in the prior art, for a flexible display screen such as a flexible AMOLED screen, the touch electrodes are made of a metal mesh directly formed on the surface of a Thin Film Encapsulation (TFE). However, because the metal mesh is an opaque metal material, there is a certain degree of blockage, which affects the optical effect of the AMOLED screen.

SUMMARY OF THE INVENTION

The embodiment of the present invention provides a flexible display panel and a flexible display device. By reducing the arrangement density of the metal traces of the metal mesh, the shielding of the light of the sub pixels by the metal traces of the metal mesh is reduced, so that the transmittance of the light emitted by the sub pixels is higher, thereby improving the display effect of the flexible display panel.

The embodiment of the present invention provides a flexible display panel, comprising a flexible substrate; an organic light emitting diode layer, disposed on the flexible substrate, wherein the organic light emitting diode layer comprises a plurality of sub pixels arranged at intervals; a metal mesh, disposed on the organic light emitting diode layer, wherein metal traces of the metal mesh are correspondingly arranged in gaps among the plurality of sub pixels disposed at intervals, and the metal traces of the metal mesh surround to form a plurality of touch electrodes, and at least one of the touch electrodes comprises at least one first touch area, and the first touch area is correspondingly arranged with at least two of the sub pixels.

The at least one of the touch electrodes comprises a plurality of first touch areas, and a number of the sub pixels correspondingly arranged in each of the first touch areas is the same.

The at least one of the touch electrodes comprises a plurality of first touch areas, and a number of the sub pixels correspondingly arranged in a portion of the first touch areas is the same.

The at least one of the touch electrodes comprises at least one second touch area, and each of the second touch areas is correspondingly arranged with one of the sub pixels.

The plurality of touch electrodes comprise a plurality of touch electrodes at an edge portion and a plurality of touch electrodes at a center portion, and the plurality of touch electrodes located at the edge portion are disposed around the plurality of touch electrodes located at the center portion, and a density of the metal traces of the touch electrodes located at the edge portion is smaller than a density of the metal traces of the touch electrodes at the central portion.

Each of the touch electrodes comprises a plurality of first touch areas and a plurality of second touch areas, a number of first touch areas in the touch electrode at the edge portion is greater than a number of first touch areas in the touch electrode at the center portion, and a number of second touch areas in the touch electrode at the edge portion is smaller than a number of second touch areas in the touch electrode at the center portion.

A trace gap is disposed in at least one intersection of the metal traces in each of the touch electrodes, and a suspension electrode is disposed in the trace gap.

The plurality of touch electrodes comprises a plurality of first touch electrodes and a plurality of second touch electrodes, and the first touch electrode and the second touch electrode are insulated from each other and intersect to form a mutual capacitance electrode structure, and the plurality of first touch electrodes extend in a plurality of columns along a first direction, and the plurality of second touch electrodes extend in a plurality of rows along a second direction, wherein the first direction is perpendicular to the second direction.

The flexible display panel further comprises an insulating layer and a bridge, and the insulating layer is disposed on the metal mesh, and the bridge is disposed on the insulating layer, and a contact hole is formed in the insulating layer, and the bridge extends into the contact hole to electrically connect two adjacent second touch electrodes.

Moreover, the embodiment of the present invention further provides a flexible display device, comprising a support layer and the foregoing flexible display panel arranged on the support layer.

In conclusion, in the embodiment of the present invention, the metal traces of the metal mesh do not surround each sub pixel in the organic light emitting diode layer for layout to reduce the arrangement density of the metal traces of the metal mesh, thus, the shielding of the light of the sub pixels by the metal traces of the metal mesh is reduced, so that the transmittance of the light emitted by the sub pixels is higher, thereby improving the overall display effect of the display area of the flexible display panel. In addition, a trace gap is arranged in at least one intersection of metal traces in each touch electrode. While the optical uniformity is maintained, the shielding of the light of the sub pixels by the metal traces of the metal mesh is reduced in advance, so that the transmittance of the light emitted by the sub pixels is higher, thereby improving the overall display effect of the display area of the flexible display panel.

Besides, a density of the metal traces of the touch electrodes located at the edge portion is smaller than a density of the metal traces of the touch electrodes at the central portion. The viewing angle range of the edge portion of the display area of the flexible display panel can be expanded. Meanwhile, the display effect of the edge portion of the display area of the flexible display panel can also be improved.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
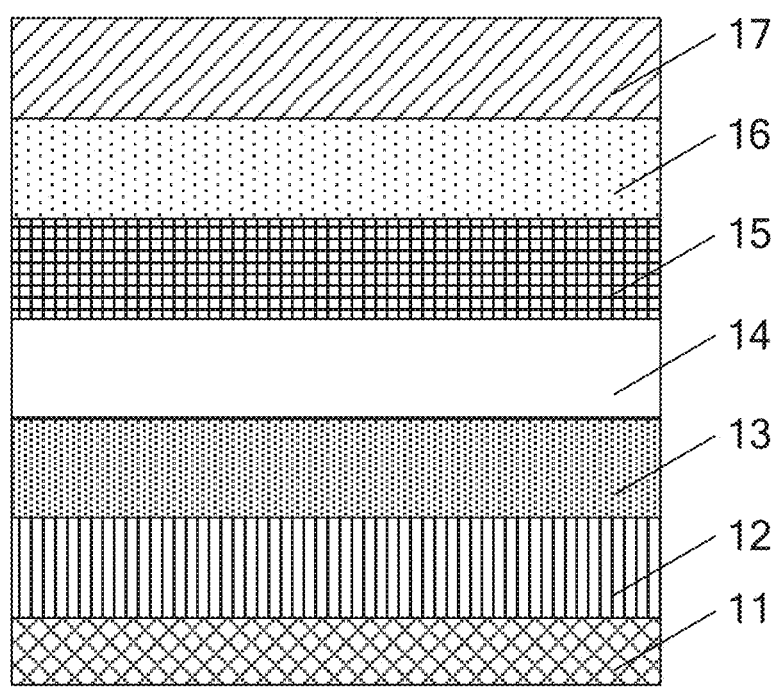
FIG. 1 is a diagram of a layer structure of a flexible display panel according to an embodiment of the present invention.

For better explaining the technical solution and the effect of the present invention, the present invention will be further described in detail with the accompanying drawings in the specific embodiments. It is clear that the described embodiments are part of embodiments of the present application, but not all embodiments. Based on the embodiments of the present invention, all other embodiments to those of ordinary skill in the premise of no creative efforts obtained, should be considered within the scope of protection of the present invention.

Besides, the following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

In the description of the invention, which needs explanation is that the term "installation"; "connected", "connection" should be broadly understood unless those are clearly defined and limited; otherwise. For example, those can be a fixed connection, a detachable connection, or an integral connection; those can be a mechanical connection, or an electrical connection; those can be a direct connection, or an indirect connection with an intermediary, which may be an internal connection of two elements. To those of ordinary skill in the art, the specific meaning of the above terminology in the present invention can be understood in the specific circumstances.

Besides, in the description of the present invention, unless with being indicated otherwise, "plurality" means two or more. In the present specification, the term "process" encompasses an independent process, as well as a process that cannot be clearly distinguished from another process but yet achieves the expected effect of the process of interest. Moreover, in the present specification, any numerical range expressed herein using "to" refers to a range including the numerical values before and after "to" as the minimum and maximum values, respectively. In figures, the same reference numbers will be used to refer to the same or like parts.

The embodiment of the present invention provides a flexible display panel. The metal traces of the metal mesh do not surround each sub pixel in the organic light emitting diode layer for layout to reduce the arrangement density of the metal traces of the metal mesh, thus, the shielding of the light of the sub pixels by the metal traces of the metal mesh is reduced, so that the transmittance of the light emitted by the sub pixels is higher, thereby improving the display effect of the flexible display panel. The flexible display panel according to an embodiment of the present invention and a flexible display device having the flexible display panel described above will be specifically described below with reference to FIGS. 1 to 11.

Please refer to FIG. 1. FIG. 1 is a diagram of a layer structure of a flexible display panel according to an embodiment of the present invention. As shown in FIG. 1, in the embodiment of the present invention, the flexible display panel comprises a flexible substrate 11, a thin film transistor (TFT) layer 12, an organic light-emitting diode (OLED) layer 13, a thin film encapsulation (TFE) layer 14, a touch layer 15, a polarizer 16 and a cover plate 17. The TFT layer 12, the OLED layer 13, the TFE layer 14, the touch layer 15, the polarizer 16, and the cover plate 17 are sequentially stacked on one side of the flexible substrate 11. Namely, the TFT layer 12 is disposed on the flexible substrate 11. The OLED layer 13 is disposed on the TFT layer 12. The TFE layer 14 is disposed on the OLED layer 13. The touch layer 15 is disposed on the TFE layer 14. The polarizer 16 is disposed on the touch layer 15. The cover plate 17 is disposed on polarizer 16.

As an optional implementation, the flexible substrate 11 is made of polyimide (PI).

In the embodiment of the present invention, the OLED layer 13 comprises a plurality of sub pixels (see FIG. 2, FIG. 5 to FIG. 10), which are arranged at intervals. The sub pixels comprise a red sub pixel R, a green sub pixel G and a blue sub pixel B. The sub pixel is self-luminous and can emit light or not emit light.

In the embodiment of the present invention, the light emitted by the sub pixels in the OLED layer 13 passes through the TFE layer 14, the touch layer 15, the polarizer 16 and the cover plate 17, and then exits.

Figures 2, 3:
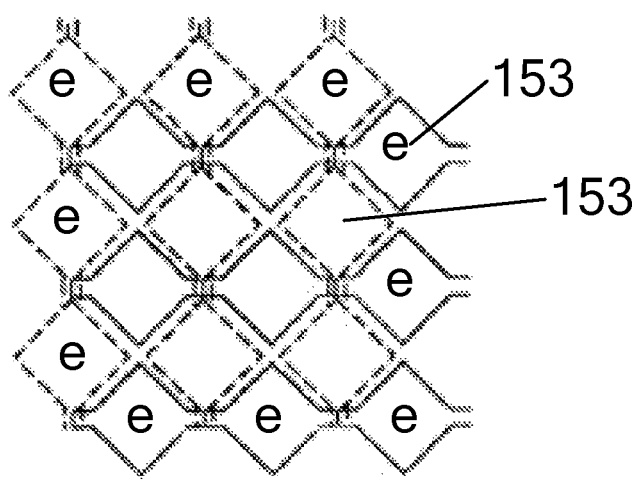
FIG. 2 is a diagram of a sub pixel arrangement according to an embodiment of the present invention.
FIG. 3 is a structural diagram of a metal mesh according to an embodiment of the present invention.

Please refer to FIG. 2. FIG. 2 is a diagram of a sub pixel arrangement according to an embodiment of the present invention. As shown in FIG. 2, the plurality of the sub pixels disposed in the OLED layer 13 is arranged in an array. The array arrangement shown in FIG. 2 is called the RGRB Diamond arrangement. It can be understood that the sub pixel arrangement of the present invention is not limited to the RGRB Diamond arrangement shown in FIG. 2. Any other arrangements may be used and the present invention has no restrictions thereto. Besides, the sub pixels shown in FIG. 2 are only a portion of sub pixels in the OLED layer 13. The number is not limited herein.

In the embodiment of the present invention, the TFE layer 14 encapsulates the layers (including the flexible substrate 11, the TFT layer 12 and the OLED layer 13) below the TFE layer 14 in the flexible display panel, and is used for fixing and sealing.

In the embodiment of the present invention, the touch layer 15 comprises a metal mesh directly formed on the TFE layer 14, and an insulating layer 18 and a bridge 19 (see FIG. 4) disposed on the metal mesh. The metal traces of the metal mesh are correspondingly arranged in gaps among the plurality of sub pixels disposed at intervals. Namely, the projections of the metal traces of the metal mesh on the OLED layer 13 are in gaps among the plurality of sub pixels disposed at intervals.

In the embodiment of the present invention, a line width of the metal trace of the bridge 19 is greater than a line width of the metal trace of the metal mesh. Specifically, the line width of the metal trace of the metal mesh is larger than or equal to 2 µm and smaller than or equal to 3 µm. The line width of the metal trace of the bridge 19 is larger than or equal to 2.5 µm and smaller than or equal to 3.5 µm.

In the embodiment of the present invention, the cover plate 17 is used to for wear prevention and drop resistance and is protective for the overall structure of the flexible display panel. In some embodiments, a material of the cover plate 17 is glass and the material is not limited herein.

Please refer to FIG. 3, FIG. 3 is a structural diagram of a metal mesh according to an embodiment of the present invention. As shown in FIG. 3, in the embodiment of the present invention, the metal traces of the metal mesh surround to form a plurality of touch electrodes 153 (see FIGS. 5 to 10). The plurality of touch electrodes 153 comprises a plurality of first touch electrodes 151 and a plurality of second touch electrodes 152. The first touch electrode 151 and the second touch electrode 152 are insulated from each other. The first touch electrode 151 intersects with the second touch electrode 152, Specifically, the plurality of first touch electrodes 151 extend in a plurality of columns along a first direction. The two adjacent first touch electrodes 151 in each column are electrically connected to each other in the extending direction (i.e. the first direction). The plurality of second touch electrodes 152 extend in a plurality of rows along a second direction. The two adjacent second touch electrodes 152 in each row are disconnected at the connection between the two adjacent first touch electrodes 151. The connection of the two adjacent second touch electrodes is made through the bridge 19 (see FIG. 4). Specifically, two adjacent second touch electrodes 152 in each row are disconnected at the connection between two adjacent first touch electrodes 151 disposed in the first direction. The connection of the two adjacent second touch electrodes is made through the bridge 19.

The first direction is perpendicular with the second direction. As an optional implementation, as shown in FIG. 3, the first direction is a vertical direction and the second direction is a horizontal direction. Namely, the first touch electrodes 151 extend along the vertical direction and the second touch electrodes 152 extend along the horizontal direction. The first touch electrodes 151 and the second touch electrodes 152 are arranged crosswise overall.

In the embodiment of the present invention, the first touch electrode 151 is a touch sensing electrode (RX), and the second touch electrode 152 is a touch driving electrode (TX). The first touch electrode 151 extended in the vertical direction and the second touch electrode 152 extended in the horizontal direction intersect to form a mutual capacitance electrode structure. The first touch electrode 151 and the second touch electrode 152 are electrically insulated at the intersection.

In the embodiment of the present invention, as shown in FIG. 3, the first touch electrodes 151 and the second touch electrodes 152 are both diamond-shaped touch electrodes.

Figure 4:
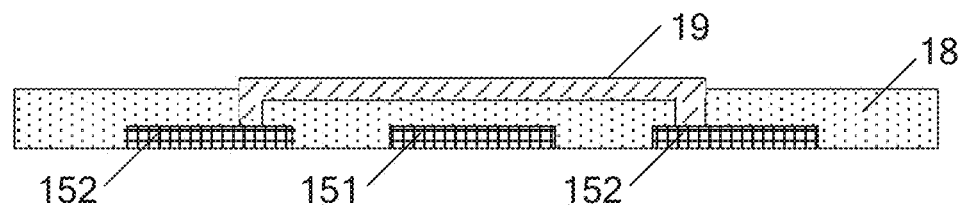
FIG. 4 is a connection diagram of a touch electrode and a bridge according to an embodiment of the present invention.

Please refer to FIG. 4. FIG. 4 is a connection diagram of a touch electrode and a bridge according to an embodiment of the present invention. As shown in FIG. 4, in the embodiment of the present invention, the two adjacent second touch electrodes 152 in each row are electrically connected to each other via the metal traces of the bridge 19.

In the embodiment of the present invention, a contact hole is formed in the insulating layer 18, and the bridge 19 extends into the contact hole to electrically connect two adjacent second touch electrodes 152. Specifically, the metal trace of the bridge 19 extends into the contact hole and crosses the insulating layer 18 to electrically connect two adjacent second touch electrodes 152 in each row.

In the embodiment of the present invention, the touch electrode 153 is any one of the first touch electrode 151 and the second touch electrode 152. The following description about the touch electrode 153 applies to both the first touch electrode 151 and the second touch electrode 152. The touch electrode 153 shown in FIG. 5 to FIG. 10 may be the first touch electrode 151, and may also be the second touch electrode 152.

In the embodiment of the present invention, at least one of the touch electrodes 153 comprises at least one first touch area 1531 (see FIGS. 5 to 9). The first touch area 1531 is correspondingly arranged with at least two of the sub pixels. In the embodiment of the present invention, the first touch area 1531 is correspondingly arranged with four of the sub pixels for illustration.

As an optional implementation, the touch electrode 153 is correspondingly arranged with a plurality of the sub pixels arranged in an array as shown in FIG. 5 to FIG. 10.

In one specific embodiment, at least one of the touch electrodes 153 comprises a plurality of first touch areas 1531 as shown in FIGS. 5 to 9.

As an optional implementation, a number of sub pixels correspondingly arranged in each of the plurality of first touch areas 1531 is the same as shown in FIG. 5 and FIG. 7 to FIG. 9.

In one specific embodiment, at least one of the touch electrodes 153 merely comprises a plurality of first touch areas 1531 as shown in FIGS. 5 to 8.

Figure 5:
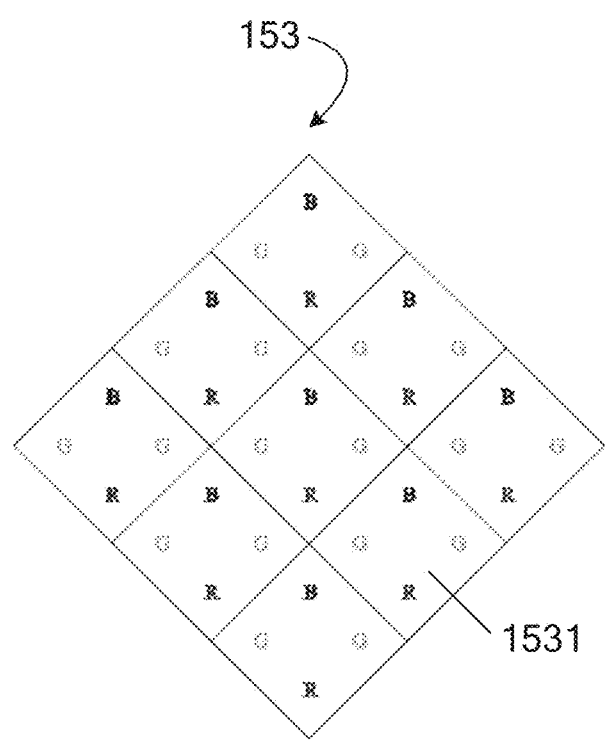
FIG. 5 is a structural diagram of a touch electrode according to the first embodiment of the present invention.

Please refer to FIG. 5. FIG. 5 is a structural diagram of a touch electrode according to the first embodiment of the present invention. As an optional implementation, as shown in FIG. 5, at least one of the touch electrodes 153 comprises nine first touch areas 1531. Each of the first touch areas 1531 is correspondingly arranged with two green sub pixels G, one red sub pixel R and one blue sub pixel B. The two green sub pixels G, one red sub pixel R and one blue sub pixel B located in each of the first touch areas 1531 shown in FIG. 5 constitute one GRGB pixel unit. In other embodiments, the number and arrangement of the sub pixels corresponding to the first touch area 1531 are not limited thereto.

Figure 6:
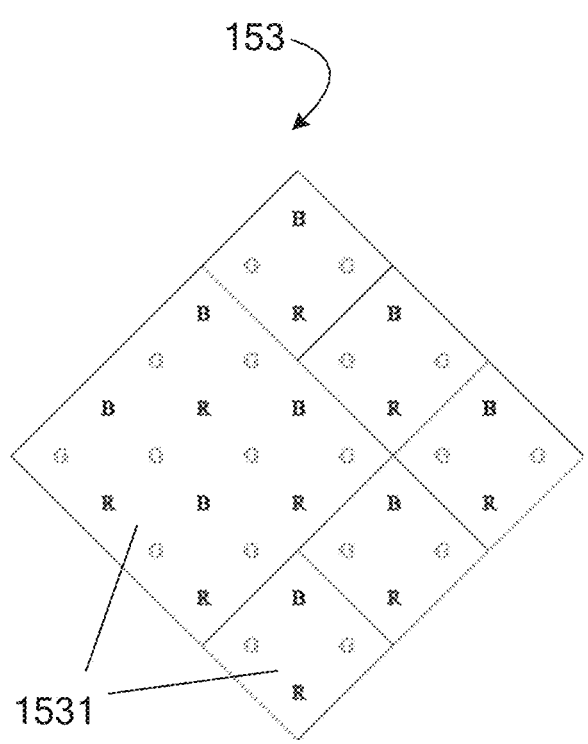
FIG. 6 is a structural diagram of a touch electrode according to the second embodiment of the present invention.

As another optional implementation, a number of sub pixels correspondingly arranged in a portion of the plurality of first touch areas 1531 is the same as shown in FIG. 6. Please refer to FIG. 6, FIG. 6 is a structural diagram of a touch electrode according to the second embodiment of the present invention. As an optional implementation, as shown in FIG. 6, at least one of the touch electrodes 153 comprises six first touch areas 1531. The five first touch areas 1531 is correspondingly arranged with one GRGB pixel unit and one of the first touch areas 1531 is correspondingly arranged with four GRGB pixel units.

Figure 7:
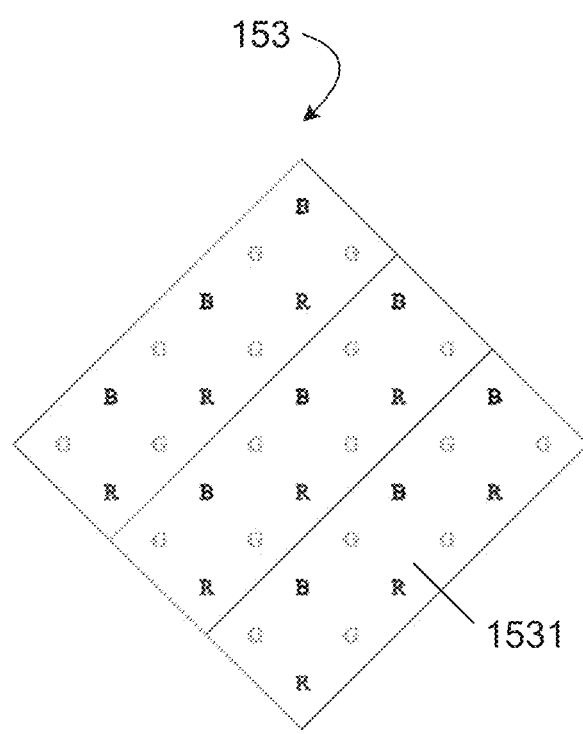
FIG. 7 is a structural diagram of a touch electrode according to the third embodiment of the present invention.
Figure 8:
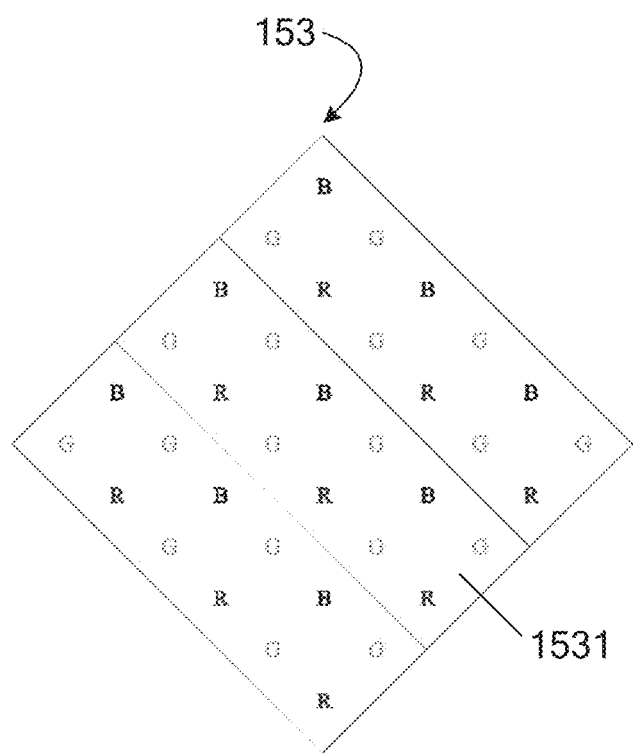
FIG. 8 is a structural diagram of a touch electrode according to the fourth embodiment of the present invention.

Please refer to FIG. 7 and FIG. 8. FIG. 7 is a structural diagram of a touch electrode according to the third embodiment of the present invention. FIG. 8 is a structural diagram of a touch electrode according to the fourth embodiment of the present invention. As an optional implementation, as shown in FIG. 7 or FIG. 8, at least one of the touch electrodes 153 comprises three first touch areas 1531. Each of the first touch areas 1531 is correspondingly arranged with three of the GRGB pixel units.

Figure 9:
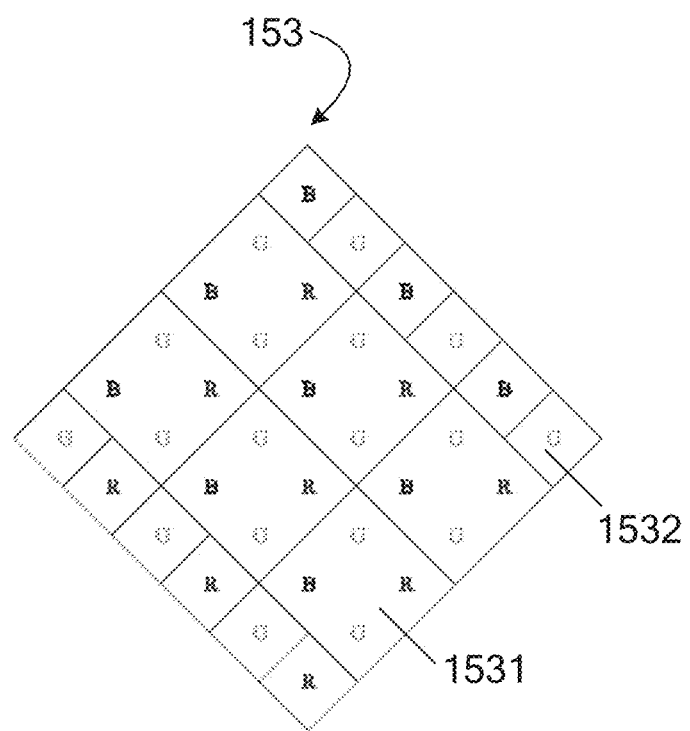
FIG. 9 is a structural diagram of a touch electrode according to the fifth embodiment of the present invention.
Figure 10:
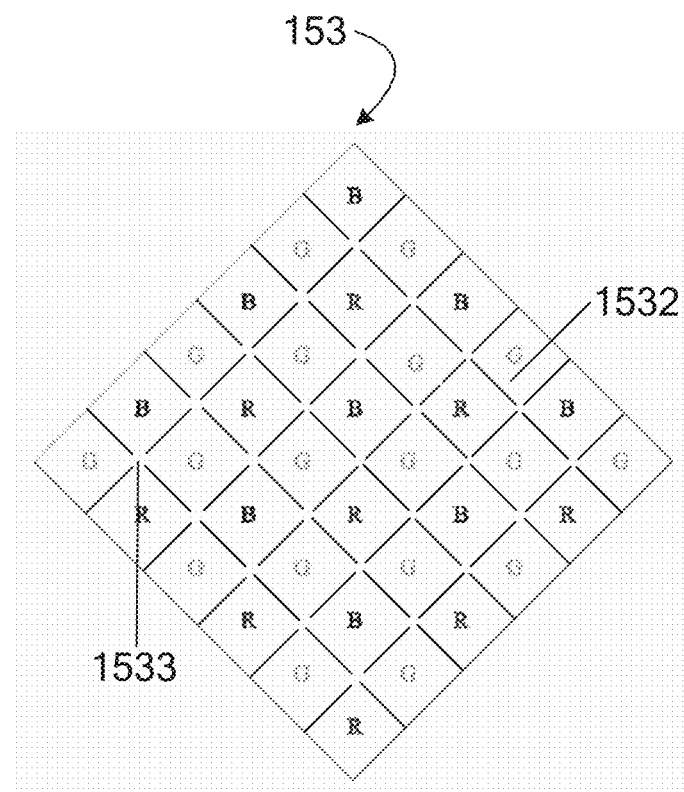
FIG. 10 is a structural diagram of a touch electrode according to the sixth embodiment of the present invention.

As an optional implementation, at least one of the touch electrodes 153 comprises at least one second touch area 1532 (see FIGS. 9 and 10). The second touch area 1532 is correspondingly arranged with one of the sub pixels. The sub pixel can be any one of the red sub pixel R, the green sub pixel G and the blue sub pixel B.

In another specific embodiment, at least one of the touch electrodes 153 comprises at least one of the first touch areas 1531 and at least one of the second touch areas 1532. The first touch area 1531 is correspondingly arranged with at least four of the sub pixels.

Please refer to FIG. 9. FIG. 9 is a structural diagram of a touch electrode according to the fifth embodiment of the present invention. As an optional implementation, as shown in FIG. 9, at least one of the touch electrodes 153 comprises six first touch areas 1531 and twelve second touch areas 1532. Each of the first touch areas 1531 is correspondingly arranged with one of the GRGB pixel units. It can be understood that the arrangements of the first touch areas 1531 and the second touch areas 1532 of the present invention are not limited to the arrangement shown in FIG. 9, and any other arrangements may be used. The repeated description is omitted here.

In one another specific embodiment, at least one of the touch electrodes 153 comprises only a plurality of the second touch areas 1532.

Please refer to FIG. 10. FIG. 10 is a structural diagram of a touch electrode according to the sixth embodiment of the present invention. As an optional implementation, as shown in FIG. 10, at least one of the touch electrodes 153 comprises thirty six second touch areas 1532.

In the embodiment of the present invention, a trace gap 1533 is disposed in at least one intersection of the metal traces in each of the touch electrodes 153, and a suspension electrode is disposed in the trace gap 1533, As an optional implementation, the trace gap 1533 is disposed at each intersection of the metal traces in each of the touch electrodes 153. In the embodiment of the present invention, assuming that the trace gap 1533 is provided at each intersection of the metal traces in the touch electrode 153 shown in FIG. 10 as an illustration. As shown in FIG. 10, the trace gap 1533 is disposed at each intersection of the metal traces in the touch electrode 153. Namely, the intersection of any adjacent four second touch regions 1532 is formed with the trace gap 1533.

As an optional implementation, a suspension electrode is also disposed at a middle position between the first touch electrode 151 and the second touch electrode 152 adjacent to each other (i.e. the gap between the first touch electrode 151 and the second touch electrode 152 adjacent to each other). In the embodiment of the present invention, the arrangement of the suspension electrode in the trace gap 1533 and the arrangement of the suspension electrode between the first touch electrode 151 and the second touch electrode 152 can realize the mutual capacitance adjustment between the touch driving electrode (TX) and the touch sensing electrodes (RX). It helps to match the capacitive value compatible with the touch driving chip, thus improving the touch sensitivity of the flexible display panel.

In the embodiment of the present invention, according to the arrangement and distribution of sub pixels, the touch electrode 153 comprises a plurality of touch electrodes 153 at the edge portion and a plurality of touch electrodes 153 at the central portion. The plurality of the touch electrodes 153 located at the edge portion are disposed around the plurality of touch electrodes 153 located at the center portion. The touch electrode 153 located at the central portion comprises all of the plurality of touch electrodes 153 located at the inner side of the edge portion. A density of the metal traces of the touch electrodes 153 located at the edge portion is smaller than a density of the metal traces of the touch electrodes 153 at the central portion. It can be understood that the edge portion may be an edge portion of the display area of the flexible display panel and the central portion may be a central portion of the display area of the flexible display panel. Specifically, the touch electrode in the central portion comprises a plurality of touch electrodes arranged toward the central position relative to the touch electrodes in the edge portion. The touch electrodes 153 shown in FIG. 3 are illustrated as all the touch electrodes 153 surrounded by the metal traces of the metal mesh. For convenience, the touch electrodes in FIG. 3 are divided into touch electrodes 153 with an identifier "e" and touch electrodes 153 without an identifier "e". The touch electrodes 153 with an identifier "e" represent the touch electrodes 153 located at the edge portion. The touch electrodes 153 without an identifier "e" represent the touch electrodes 153 located at the central portion.

As an optional implementation, each of the touch electrodes 153 comprises a plurality of first touch areas 1531 and a plurality of second touch areas 1532. A number of first touch areas 1531 in the touch electrode 153 at the edge portion is greater than a number of first touch areas 1531 in the touch electrode 153 at the center portion, and a number of second touch areas 1532 in the touch electrode 153 at the edge portion is smaller than a number of second touch areas 1532 in the touch electrode 153 at the center portion. Therefore, a density of the metal traces of the touch electrodes located at the edge portion is smaller than a density of the metal traces of the touch electrodes at the central portion. The viewing angle range of the edge portion of the display area of the flexible display panel can be expanded. Meanwhile, the display effect of the edge portion of the display area of the flexible display panel can also be improved.

Since at least one touch electrode comprises at least one first touch area in the embodiment of the present invention, the metal mesh do not surround each sub pixel in the OLED layer for layout. In comparison with the prior art that the metal mesh surrounds each sub pixel in the OLED layer for layout, the embodiment of the present invention reduces the arrangement density of the metal traces of the metal mesh, thus, the shielding of the light of the sub pixels by the metal traces of the metal mesh is reduced, so that the transmittance of the light emitted by the sub pixels is higher, thereby improving the overall display effect of the display area of the flexible display panel. In addition, a trace gap is arranged in at least one intersection of metal traces in each touch electrode in the embodiment of the present invention. While the optical uniformity is maintained, the shielding of the light of the sub pixels by the metal traces of the metal mesh is reduced in advance, so that the transmittance of the light emitted by the sub pixels is higher, thereby improving the overall display effect of the display area of the flexible display panel.

Figure 11:
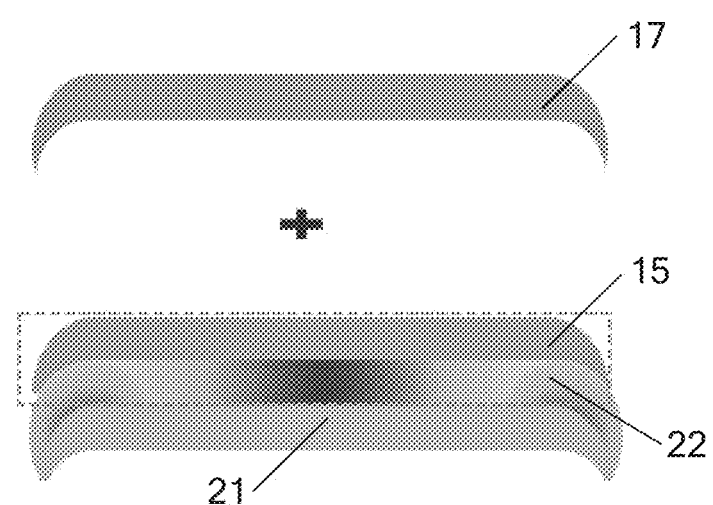
FIG. 11 is a diagram of a layer structure of a flexible display device according to an embodiment of the present invention.

Correspondingly, the embodiment of the present invention further provides a flexible display device, comprising the foregoing flexible display panel. As an optional implementation, the flexible display device adopts a double curved surface design. Specifically, referring to FIG. 11, which is a diagram of a layer structure of a flexible display device according to an embodiment of the present invention. As shown in FIG. 11, the flexible display device comprises a support layer 21, a display layer 22, and a touch layer 15 and a cover plate 17 as shown in FIG. 1. In the embodiment of the present invention, the display layer 22 is disposed on the support layer 21. The touch layer 15 is disposed on the display layer 22. The cover plate 17 is disposed on the touch layer 15.

In the embodiment of the present invention, the support layer 21 is used for supporting and fixing. The display layer 22 and the touch layer 15 are designed as curved surfaces, that is, the flexible display device is designed as a double curved surface as a whole.

In the embodiment of the present invention, the display layer 22 comprises the TFT layer 12, the OLED layer 13 and the TFE layer 14 shown in FIG. 1. The metal mesh in the touch layer 15 is directly formed on the top surface of the TFE layer 14. As an optional implementation, the metal mesh is directly formed on the top surface of the TFE layer 14 by deposition. Specifically, first, an entire metal conductive layer is deposited on the top surface of the TFE layer 14. Then, the metal conductive layer is patterned by a photolithography process to form a plurality of rhombic touch driving electrodes (TX) and touch sensing electrodes (RX).

Specifically, at least, the flexible substrate 11 shown in FIG. 1 may be further provided between the support layer 21 and the display layer 22. At least, the polarizer 16 shown in FIG. 1 may be further provided between the touch layer 15 and the cover plate 17. In the embodiment of the present invention, the cover plate 17 is used to for wear prevention and drop resistance and is protective for the overall structure of the flexible display device. In some embodiments, a material of the cover plate 17 is glass and the material is not limited herein.

In practical applications, the flexible display device may include, but not limited to a mobile phone with the foregoing flexible display panel (such as an Android mobile phone, an iOS mobile phone, etc.), a tablet computer, a mobile internet device (MID), a personal digital assistant (PDA), a laptop, a TV set, an electronic paper, a digital photo frame and etc.

In the embodiment of the present invention, the metal traces of the metal mesh do not surround each sub pixel in the OLED layer for layout to reduce the arrangement density of the metal traces of the metal mesh, thus, the shielding of the light of the sub pixels by the metal traces of the metal mesh is reduced, so that the transmittance of the light emitted by the sub pixels is higher, thereby improving the overall display effect of the display area of the flexible display panel. In addition, a trace gap is arranged in at least one intersection of metal traces in each touch electrode in the embodiment of the present invention. While the optical uniformity is maintained, the shielding of the light of the sub pixels by the metal traces of the metal mesh is reduced in advance, so that the transmittance of the light emitted by the sub pixels is higher, thereby improving the overall display effect of the display area of the flexible display panel. Besides, a density of the metal traces of the touch electrodes located at the edge portion is smaller than a density of the metal traces of the touch electrodes at the central portion. The viewing angle range of the edge portion of the display area of the flexible display panel can be expanded. Meanwhile, the display effect of the edge portion of the display area of the flexible display panel can also be improved.

In the description of the present specification, the reference terms, "one embodiment", "some embodiments", "an illustrative embodiment", "an example", "a specific example", or "some examples" mean that such description combined with the specific features of the described embodiments or examples, structure, material, or characteristic is included in the utility model of at least one embodiment or example. In the present specification, the terms of the above schematic representation do not certainly refer to the same embodiment or example. Meanwhile, the particular features, structures, materials, or characteristics which are described may be combined in a suitable manner in any one or more embodiments or examples.

The detail description has been introduced above for the flexible display panel and the flexible display device provided by the embodiment of the invention. Herein, a specific case is applied in this article for explain the principles and specific embodiments of the present invention have been set forth. The description of the aforesaid embodiments is only used to help understand the method of the present invention and the core idea thereof; meanwhile, for those of ordinary skill in the art, according to the idea of the present invention, there should be changes either in the specific embodiments and applications but in sum, the contents of the specification should not be limitation to the present invention,

What is claimed is:

1. A flexible display panel, comprising:
a flexible substrate;
an organic light emitting diode layer, which is disposed on the flexible substrate, wherein the organic light emitting diode layer comprises a plurality of sub pixels arranged at intervals;
a metal mesh, which is disposed on the organic light emitting diode layer, wherein the metal mesh comprises metal traces that are correspondingly arranged in gaps among the plurality of sub pixels disposed at intervals, and the metal traces of the metal mesh are arranged to form a plurality of touch electrodes, and at least one of the touch electrodes comprises at least one first touch area, wherein the first touch area comprises multiple ones of the metal traces, and the multiple ones of the metal traces are arranged to form an enclosed configuration that encloses at least two of the plurality of sub pixels, wherein the at least two sub pixels are completely located inboard of the enclosed configuration formed of the multiple metal traces of the first touch area.

2. The flexible display panel according to claim 1, wherein the at least one of the touch electrodes comprises a plurality of first touch areas, and a number of the sub pixels correspondingly arranged in each of the first touch areas is the same.

3. The flexible display panel according to claim 1, wherein the at least one of the touch electrodes comprises a plurality of first touch areas, and a number of the sub pixels correspondingly arranged in a portion of the first touch areas is the same.

4. The flexible display panel according to claim 1, wherein the at least one of the touch electrodes comprises at least one second touch area, and each of the second touch areas is correspondingly arranged with one of the sub pixels.

5. The flexible display panel according to claim 4, wherein the plurality of touch electrodes comprise a plurality of touch electrodes at an edge portion of a display area of the flexible display panel and a plurality of touch electrodes at a center portion of the display area of the flexible display panel, and the plurality of touch electrodes located at the edge portion are disposed around the plurality of touch electrodes located at the center portion, and a density of the metal traces of the touch electrodes located at the edge portion is smaller than a density of the metal traces of the touch electrodes at the central portion.

6. The flexible display panel according to claim 5, wherein each of the touch electrodes comprises a plurality of first touch areas and a plurality of second touch areas, a number of first touch areas in the touch electrode at the edge portion is greater than a number of first touch areas in the touch electrode at the center portion, and a number of second touch areas in the touch electrode at the edge portion is smaller than a number of second touch areas in the touch electrode at the center portion.

7. The flexible display panel according to claim 1, wherein a trace gap is disposed in at least one intersection of the metal traces in each of the touch electrodes.

8. The flexible display panel according to claim 1, wherein the plurality of touch electrodes comprises a plurality of first touch electrodes and a plurality of second touch electrodes, and the first touch electrode and the second touch electrode are insulated from each other and intersect to form a mutual capacitance electrode structure, and the plurality of first touch electrodes extend in a plurality of columns along a first direction, and the plurality of second touch electrodes extend in a plurality of rows along a second direction, wherein the first direction is perpendicular to the second direction.

9. The flexible display panel according to claim 8, wherein the flexible display panel further comprises an insulating layer and a bridge, and the insulating layer is disposed on the metal mesh, and the bridge is disposed on the insulating layer, and a contact hole is formed in the insulating layer, and the bridge extends into the contact hole to electrically connect two adjacent second touch electrodes.

10. The flexible display panel according to claim 2, wherein the plurality of touch electrodes comprises a plurality of first touch electrodes and a plurality of second touch electrodes, and the first touch electrode and the second touch electrode are insulated from each other and intersect to form a mutual capacitance electrode structure, and the plurality of first touch electrodes extend in a plurality of columns along a first direction, and the plurality of second touch electrodes extend in a plurality of rows along a second direction, wherein the first direction is perpendicular to the second direction.

11. A flexible display device, comprising a support layer and a flexible display panel arranged on the support layer, wherein the flexible display panel comprises:
a flexible substrate;
an organic light emitting diode layer, which is disposed on the flexible substrate, wherein the organic light emitting diode layer comprises a plurality of sub pixels arranged at intervals;
a metal mesh, which is disposed on the organic light emitting diode layer, wherein the metal mesh comprises metal traces that are correspondingly arranged in gaps among the plurality of sub pixels disposed at intervals, and the metal traces of the metal mesh are arranged to form a plurality of touch electrodes, and at least one of the touch electrodes comprises at least one first touch area, wherein the first touch area comprises multiple ones of the metal traces, and the multiple ones of the metal traces are arranged to form an enclosed configuration that encloses at least two of the plurality of sub pixels, wherein the at least two sub pixels are completely located inboard of the enclosed configuration formed of the multiple metal traces of the first touch area.

12. The flexible display device according to claim 11, wherein the at least one of the touch electrodes comprises a plurality of first touch areas, and a number of the sub pixels correspondingly arranged in each of the first touch areas is the same.

13. The flexible display device according to claim 11, wherein the at least one of the touch electrodes comprises a plurality of first touch areas, and a number of the sub pixels correspondingly arranged in a portion of the first touch areas is the same.

14. The flexible display device according to claim 11, wherein the at least one of the touch electrodes comprises at least one second touch area, and each of the second touch areas is correspondingly arranged with one of the sub pixels.

15. The flexible display device according to claim 14, wherein the plurality of touch electrodes comprise a plurality of touch electrodes at an edge portion of a display area of the flexible display panel and a plurality of touch electrodes at a center portion of the display area of the flexible display panel, and the plurality of touch electrodes located at the edge portion are disposed around the plurality of touch electrodes located at the center portion, and a density of the metal traces of the touch electrodes located at the edge portion is smaller than a density of the metal traces of the touch electrodes at the central portion.

16. The flexible display device according to claim 15, wherein each of the touch electrodes comprises a plurality of first touch areas and a plurality of second touch areas, a number of first touch areas in the touch electrode at the edge portion is greater than a number of first touch areas in the touch electrode at the center portion, and a number of second touch areas in the touch electrode at the edge portion is smaller than a number of second touch areas in the touch electrode at the center portion.

17. The flexible display device according to claim 11, wherein a trace gap is disposed in at least one intersection of the metal traces in each of the touch electrodes.

18. The flexible display device according to claim 11, wherein the plurality of touch electrodes comprises a plurality of first touch electrodes and a plurality of second touch electrodes, and the first touch electrode and the second touch electrode are insulated from each other and intersect to form a mutual capacitance electrode structure, and the plurality of first touch electrodes extend in a plurality of columns along a first direction, and the plurality of second touch electrodes extend in a plurality of rows along a second direction, wherein the first direction is perpendicular to the second direction.

19. The flexible display panel according to claim 18, wherein the flexible display panel further comprises an insulating layer and a bridge, and the insulating layer is disposed on the metal mesh, and the bridge is disposed on the insulating layer, and a contact hole is formed in the insulating layer, and the bridge extends into the contact hole to electrically connect two adjacent second touch electrodes.

20. The flexible display device according to claim 12, wherein the plurality of touch electrodes comprises a plurality of first touch electrodes and a plurality of second touch electrodes, and the first touch electrode and the second touch electrode are insulated from each other and intersect to form a mutual capacitance electrode structure, and the plurality of first touch electrodes extend in a plurality of columns along a first direction, and the plurality of second touch electrodes extend in a plurality of rows along a second direction, wherein the first direction is perpendicular to the second direction.

* * * * *